United States Patent [19]

Kapoor et al.

[11] Patent Number: 5,098,854
[45] Date of Patent: Mar. 24, 1992

[54] PROCESS FOR FORMING SELF-ALIGNED SILICIDE BASE CONTACT FOR BIPOLAR TRANSISTOR

[75] Inventors: Ashok K. Kapoor, Palo Alto; Hemraj K. Hingarh, San Jose, both of Calif.

[73] Assignee: National Semiconductor Corporation, Santa Clara, Calif.

[21] Appl. No.: 609,130

[22] Filed: Nov. 1, 1990

Related U.S. Application Data

[63] Continuation of Ser. No. 293,540, Jan. 3, 1989, abandoned, which is a continuation of Ser. No. 8,044, Jan. 21, 1987, abandoned, which is a continuation of Ser. No. 629,039, Jul. 9, 1984, abandoned.

[51] Int. Cl.$^5$ ............... H01L 21/331; H01L 21/283
[52] U.S. Cl. ........................... 437/31; 437/162; 437/200; 437/984
[58] Field of Search .............. 437/31, 33, 200, 162, 437/984; 148/DIG. 147, DIG. 19; 357/34, 43

[56] References Cited

U.S. PATENT DOCUMENTS

| | | | |
|---|---|---|---|
| 4,080,719 | 3/1978 | Wilting | 437/200 |
| 4,159,915 | 7/1979 | Anantha et al. | 437/178 |
| 4,188,707 | 2/1980 | Asano et al. | 437/189 |
| 4,259,680 | 3/1981 | Lepselter et al. | 437/162 |
| 4,381,953 | 5/1983 | Ho et al. | 148/1.5 |
| 4,384,301 | 5/1983 | Tasch, Jr. et al. | 437/200 |
| 4,398,962 | 8/1983 | Kanagawa | 437/33 |
| 4,419,810 | 12/1983 | Riseman | 437/200 |
| 4,443,493 | 4/1984 | Delfino | 437/173 |
| 4,445,268 | 5/1984 | Hirao | 437/31 |
| 4,478,679 | 10/1984 | Chang et al. | 29/591 X |
| 4,484,211 | 11/1984 | Takemoto et al. | 357/50 |
| 4,485,550 | 12/1984 | Koeneke et al. | 29/591 X |
| 4,521,952 | 6/1985 | Riseman | 437/33 |
| 4,622,735 | 11/1986 | Shibata | 437/200 |

FOREIGN PATENT DOCUMENTS 2081507A 2/1982 United Kingdom .

OTHER PUBLICATIONS

Murarka, S. P., "Refractory Silicides for Integrated Circuits", J. Vac. Sci. Technol., 17(4), Jul./Aug. 1980, pp. 775–792.
Nagasawa et al., Japan J. Appl. Phys., vol. 22, No. 1, Jan. 1983, pp. L57–L59.
Schaber et al., IEDM Technical Digest, 1984, pp. 738–741.
DeGraff et al., IEEE Trans. Elec. Devices, vol. ED-26, No. 11, Nov. 1979, pp. 1771–1776.
Tsukamoto et al., IEDM Technical Digest, 1984, pp. 130–133.
Lau et al., IEDM Technical Digest, 1982, pp. 714–717.

*Primary Examiner*—Olik Chaudhuri
*Assistant Examiner*—T. N. Quach
*Attorney, Agent, or Firm*—Townsend and Townsend

[57] ABSTRACT

A self-aligned silicide base contact structure for a bipolar transistor, and a process for fabricating the structure are disclosed. The structure has four key elements: a base region 36, a polycrystalline silicon emitter contact region 50, a spacer oxide 60 and 62, and a base contact 74 formed of metal silicide. The spacer oxide is an insulator that electrically isolates the side walls of the emitter contact region from the upper surface of the base region. The spacer oxide is a residual amount of oxide that is left on the side walls of the emitter contact region after anisotropic etching is used to remove most of a covering layer of oxide. The metal silicide base contact is created on an exposed upper surface of the base region, and is formed by first depositing a metal layer on the upper surface of the base region, and then heat treating. Where metal and silicon atoms are in contact, such as along the exposed upper surface of the base region, metal silicide forms.

11 Claims, 4 Drawing Sheets

PROCESS FOR FORMING SELF-ALIGNED SILICIDE BASE CONTACT FOR BIPOLAR TRANSISTOR

This is a continuation of application Ser. No. 07/293,540, filed Jan. 3, 1989, now abandoned which is a continuation of 008,044 filed Jan. 21, 1987, now abandoned which is a continuation of 692,039 filed Feb. 9, 1984, now abandoned.

BACKGROUND OF THE INVENTION

1. Field of the Invention

This invention relates generally to integrated circuits and bipolar transistors formed therein, and relates more particularly to a structure forming, and a process for fabricating, a self-aligned metal silicide base contact for a bipolar transistor.

2. Description of the Prior Art

Parasitic capacitances and resistances limit the switching speed of a bipolar transistor. Two related factors that restrict transistor switching speed are: (1) a parasitic base resistance between the base contact and the active area of the transistor, and (2) a parasitic capacitance between the base region and the collector region. Each time that the transistor switches, the base current charges or discharges this parasitic capacitance. The base current is impeded by the parasitic base resistance. To increase switching speed, the product of the parasitic base resistance and the parasitic capacitance must be reduced.

Certain design parameters also affect the switching speed of a bipolar transistor. The dopant levels of the p and n conductivity regions of the transistor affect the magnitude of the parasitic base resistance and capacitance. While increasing the dopant level of the base region causes the parasitic base resistance to decrease, it also causes the parasitic capacitance to increase by a proportionate amount. The net result is no gain in switching speed.

Another design parameter, the physical dimensions of the transistor, affects the magnitude of the parasitic base resistance. The magnitude of the parasitic base resistance is proportional to the distance between the active area of the transistor and the base contact, where the base contact is a conductor that supplies the base current to the base region. It is desirable to minimize this distance to minimize the parasitic base resistance. Since in a vertical device the active area of the transistor is directly below the emitter, the distance to be minimized is the distance between the emitter and the base contact. The emitter and the base contact must be electrically isolated for the transistor to function. A lower bound on the distance between the emitter and the base contact is the thickness of a layer of insulation that electrically separates the two.

In prior art bipolar transistors, insulation between the emitter and the base contact is provided by a region of silicon dioxide. This oxide region is disposed between the emitter and a metal connection that contacts the top of the base region and forms the base contact. In fabricating such prior art bipolar transistors, the oxide region is first formed on top of the emitter and base regions, and is then photolithographically patterned to create openings to the emitter and base regions. Metal is then deposited in the openings, with the base contact formed by the metal in the opening to the base. The minimum distance between the base contact and emitter is limited by the capabilities of the photolithographic process. Separation distances between the emitter and base contact in the range of two to three micrometers have been achieved in prior art bipolar transistors.

Other design techniques are known to be useful in increasing the switching performance of bipolar transistors. One technique uses a Schottky diode connected across the base and collector of a bipolar transistor to form a Schottky clamped transistor. The Schottky diode limits the charge stored by the base to increase switching speed. Another technique uses tunnel emitters to speed up the transistor.

SUMMARY OF THE INVENTION

In accordance with the illustrated preferred embodiment, the present invention provides a self-aligned structure for a bipolar transistor, and also provides a process for fabricating the structure. The self-aligned structure has a metal silicide base contact that advantageously reduces parasitic base resistance. The process of fabricating the structure utilizes individual integrated circuit fabrication process steps that are commonly practiced within the semiconductor industry. Although the structure and the process are described herein with reference to n-p-n transistors, they apply to p-n-p transistors as well.

A self-aligned structure for a bipolar transistor, according to the present invention, has a metal silicide base contact for reducing the distance between the base contact and the active area of the transistor, thereby reducing parasitic base resistance and increasing transistor switching speed. The structure has four key elements: a base region, a polycrystalline silicon emitter contact region, a spacer oxide, and a base contact formed of metal silicide. The base region provides a first conductivity region of the transistor. The emitter contact region provides electrical contact to a second conductivity region of the transistor, and is disposed above the base region. The spacer oxide is an insulator that electrically isolates the side walls of the emitter contact region from the upper surface of the base region. The base contact provides a conductor, metal silicide, that covers the upper surface of the base region. The base contact is separated from the emitter contact region by the thickness of the spacer oxide.

By utilizing very thin spacer oxide and a metal silicide base contact that covers the upper surface of the base region, the structure advantageously reduces the parasitic base resistance. The spacer oxide is a residual amount of oxide that remains on the side walls of the emitter region after anisotropic etching of a covering layer of oxide. The anisotropic etching process determines the thickness of the spacer oxide. The silicide base contact is thereafter formed on an exposed upper surface of the base region. It is formed by first depositing a metal layer on the exposed upper surface, and then heat treating. During heat treating, metal atoms diffuse into the underlying silicon substrate, and silicon atoms diffuse into the overlying metal layer. The metal and silicon atoms combine to form an electrically conductive compound, metal silicide. Since the upper surface of the base region extends to the spacer oxide, the base contact formed on the upper surface also extends to the spacer oxide. Thus, the silicide base contact is separated from the emitter contact region by the thickness of the spacer oxide. The thickness of the spacer oxide is very small, and may equal, for example, 0.2 to 0.3 micrometers. Accordingly, the parasitic base resistance is reduced over that of prior art transistors.

The process of the present invention is utilized to fabricate self-aligned structures for bipolar transistors on a silicon substrate. The process is utilized to fabricate the four key elements of the self-aligned structure: base region, emitter contact region, spacer oxide, and base contact. In the embodiment described herein, the base region is a lightly doped p- region within an epitaxial layer of the substrate. To form the emitter contact region, a layer of polycrystalline silicon is formed on top of the base region, and is then ion implanted to form a heavily doped n+ region. The polycrystalline silicon is then patterned and etched photolithographically, forming an emitter contact region with substantially vertical side walls. An emitter region is then created below the emitter contact region by thermally diffusing n impurities downward into the epitaxial layer. Next, an oxide layer is formed over the emitter contact and base regions. The oxide layer is then anisotropically etched until the oxide has been removed from the upper surfaces of the emitter and base regions. A residual amount of oxide remains on the side walls of the emitter contact region due to the anisotropic nature of the etching operation, which preferentially etches faster vertically than horizontally. Next, a layer of metal is deposited on the top of the substrate and the structure is heat treated. Wherever metal and silicon atoms are in contact, such as along the exposed upper surface of the base region, metal silicide forms during heat treatment. After silicide formation, all excess metal that has not formed silicide is removed. At this point the self-aligned structure is complete. Subsequent steps add oxide insulation, and metal interconnections.

A major advantage of the self-aligned structure of the present invention is that it significantly reduces parasitic base resistance, and thereby significantly increases the switching speed of a bipolar transistor employing the structure. A major advantage of the process of the present invention is that it utilizes integrated circuit fabrication processes that are commonly practiced within the semiconductor industry. Another major advantage of the process is that Schottky diodes and tunnel emitters can be fabricated as well, thereby permitting great flexibility in circuit design.

DETAILED DESCRIPTION OF THE PREFERRED EMBODIMENT

The preferred embodiment of the present invention is a structure forming, and a process for fabricating, a self-aligned metal silicide base contact for a bipolar transistor. The structure has four key elements: a base region, a polycrystalline silicon emitter contact region, a spacer of silicon dioxide, and a base contact formed of metal silicide. The spacer oxide is a very thin layer of silicon dioxide that insulates between the side walls of the emitter contact region and the base contact. The base contact provides a conductor that covers the upper surface of the base region. These elements will be described in more detail in conjunction with the following description of the process of the present invention. Although the structure and process of the present invention are described in terms of an n-p-n bipolar transistor formed on a p- silicon substrate, the scope of the invention is not to be taken as limited to only such devices and materials.

The self-aligned silicide base contact of the present invention is constructed during the fabrication of a polycrystalline silicon emitter bipolar transistor on a wafer, as shown in FIGS. 1 through 11. Although the formation of one transistor, one diode, and one resistor will be described, many such devices can be formed simultaneously on the wafer.

Figure 1:
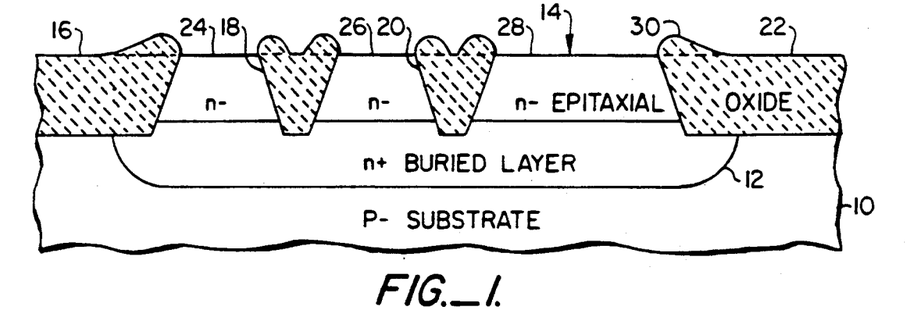
FIG. 1 is a sectional view of a semiconductor substrate after a first preliminary step during the fabrication of a self-aligned bipolar transistor.

A lightly doped p- silicon substrate 10 of <100> surface orientation provides the underlying semiconductor material of the wafer, as shown in FIG. 1. A heavily doped n+ region is diffused or implanted into the upper surface of substrate 10 and forms an n+ buried layer 12. On top of buried layer 12, a monocrystalline silicon lightly doped n- region 14 is epitaxially grown. Next, field oxide regions 16, 18, 20, and 22 are formed by the following isoplanar process: (1) The upper surface of the epitaxial layer 14 is oxidized, then coated with a layer of silicon nitride. (2) Portions of the silicon nitride are patterned photolithographically and removed from areas where oxide barriers are desired. (3) The epitaxial layer is anisotropically etched to form pockets with slanted side walls. (4) The pockets are filled by thermally growing silicon dioxide upon the side walls and bottom surfaces of the pockets. (5) All residual silicon nitride is removed. The foregoing process steps are well known in the art and known as the local oxidation of silicon, or LOCOS. See, e.g. U.S. Pat. No. 3,648,125 issued to Doug Peltzer. Of course, other well known techniques may also be employed such as trench etching and filling. The field oxide regions divides the epitaxial layer into three separate islands 24, 26, and 28. Hereinafter, all references to oxide and oxide material should be interpreted as references to silicon dioxide.

Forming the field oxide regions in the manner described above creates an uneven upper surface. This happens because the oxide grows equally from all exposed silicon surfaces, which includes both the side walls and bottom surfaces of the pockets. Humps 30, commonly known as bird's beaks, are formed at the boundaries of the pockets. Subsequent processing steps can be performed with more accuracy, and with finer precision, if the bird's beaks are removed to form a planar upper surface of the wafer. Although removal is not mandatory, it is recommended. One technique for creating a planar upper surface is disclosed U.S. patent application Ser. No. 576,665, filed Feb. 15, 1984, entitled "Semiconductor Planarization Process and Structures Made Thereby", invented by Greg Burton, and assigned to Fairchild Camera and Instrument Corporation, the assignee of this application.

Figure 2:
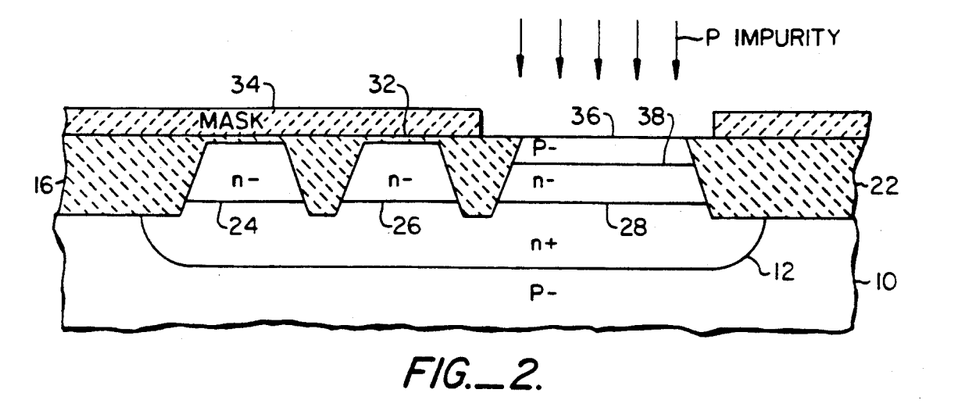
FIG. 2 is a sectional view of the semiconductor substrate after a second preliminary step during the fabrication of the self-aligned bipolar transistor.

In reference now to FIG. 2, the formation of the base region will be described. First a thermal oxide layer 32 is grown over islands 24, 26, and 28. The thickness of oxide layer 32 is not critical since it is used only as a shield during subsequent ion implantation. Next, a photomask layer 34 is applied to the upper surface of the wafer. The photomask layer 34 is patterned photolithographically, and portions are removed above island 28. Next, that portion of the thermal oxide layer 32 that is located above island 28 is removed by etching. Oxide layer 32 remains in place over islands 24 and 26. Then, island 28 is ion implanted with p type (acceptor) impurity atoms, such as, for example, boron. The impurity atoms form a lightly doped p— base region 36 on top of the remaining n-epitaxial region 38 of island 28.

Figure 3:
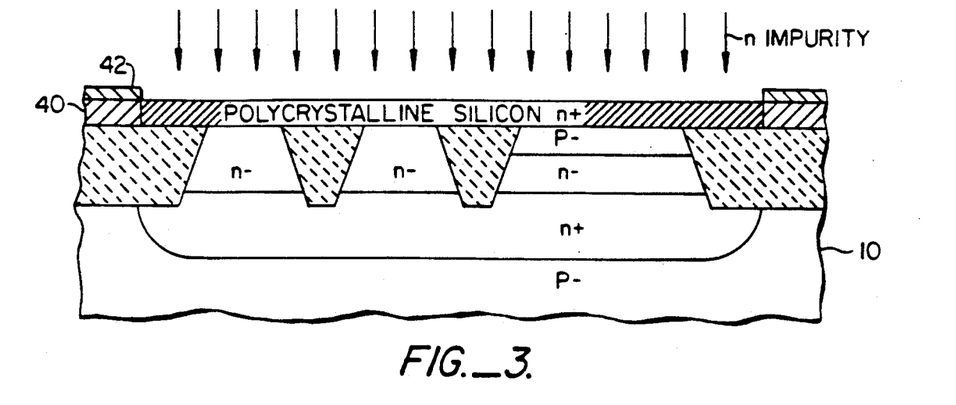
FIG. 3 is a sectional view of the semiconductor substrate after a third preliminary step during the fabrication of the self-aligned bipolar transistor.

In reference now to FIGS. 3 and 4, the formation of the emitter region will be described. First, the photomask layer 34 and the thermal oxide layer 32 are removed. Then, a layer of polycrystalline silicon 40 is deposited, for example, by chemical vapor deposition, on top of the wafer to a thickness of approximately 2500 to 5000 Angstroms. N type (donor) impurity atoms are present during the formation of layer 40, causing it to be a lightly doped n— material. Next, an oxide layer 42 is grown on top of the polycrystalline silicon layer. Oxide layer 42 is then photolithographically patterned and etched to expose portions of the polycrystalline silicon layer. Portions of oxide layer 42 remain to cover other portions of the polycrystalline layer that will later form the resistive elements of resistors. Next, the exposed portions of the polycrystalline silicon are ion implanted with n type (donor) impurity atoms to form a heavily doped n+ layer. The n type impurity atoms may be, for example, arsenic atoms. FIG. 3 shows the state of the wafer at this stage of the process.

Figure 4:
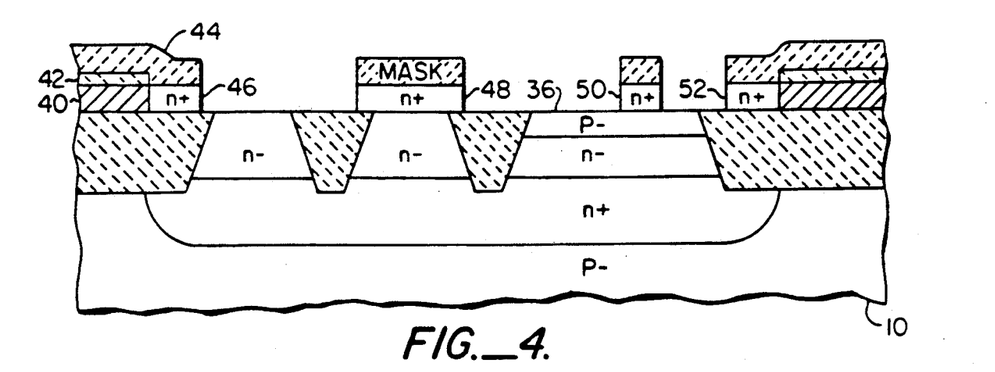
FIG. 4 is a sectional view of the semiconductor substrate after a fourth preliminary step during the fabrication of the self-aligned bipolar transistor.

Another photolithographic step is next performed to define the emitter contact region and the collector and resistor taps, as shown in FIG. 4. Another photomask layer 44 is applied to the top of the wafer. Photomask layer 44 is patterned and portions thereof are removed to expose portions of the polycrystalline silicon layer 40. The exposed portions of the polycrystalline silicon layer are then etched away, leaving four n+ regions 46, 48, 50, and 52. N+ regions 46 and 52 form resistor taps, n+ region 48 forms a collector contact region, and n+ region 50 forms an emitter contact region. All of the n+ regions have substantially vertical side walls.

At this point, the emitter contact region 50 extends upward from the upper surface of the base region 36. To form the transistor, an n+ emitter region is then created within the monocrystalline substrate. To accomplish this, the wafer is heated so that some of the n+ impurities of the emitter contact region 50 diffuse downward into the base region 36. This downward diffusion forms an n+ emitter region 54 within the monocrystalline substrate. At the same time some of the n+ impurity from polycrystalline silicon 48 will diffuse into the epitaxial layer to provide an improved n+ collector contact.

Figure 5:
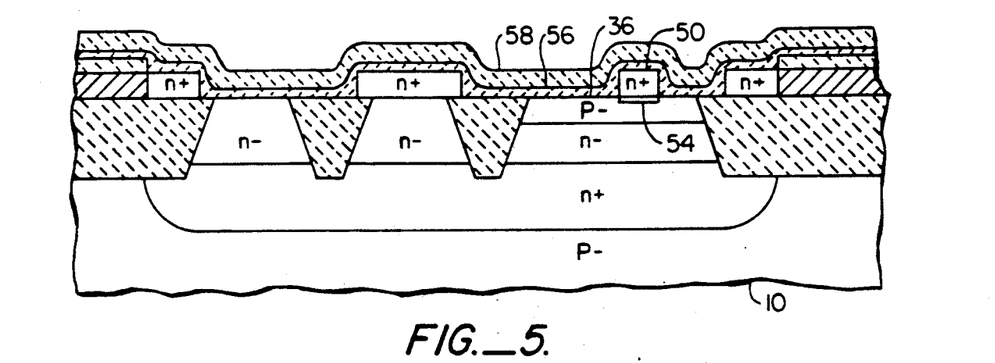
FIG. 5 is a sectional view of the semiconductor substrate after a fifth preliminary step during the fabrication of the self-aligned bipolar transistor.
Figure 6:
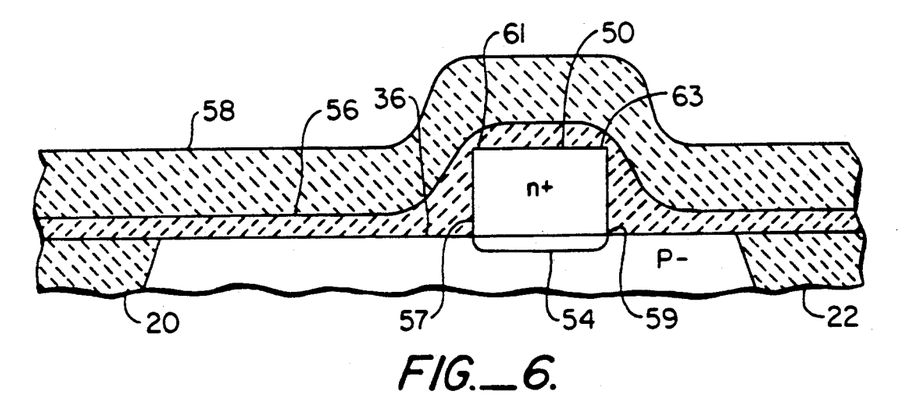
FIG. 6 is an enlarged sectional view of a portion of the semiconductor substrate shown in FIG. 5.

The formation of a double oxide layer is the next step in the process of the present invention, and is illustrated in FIG. 5. An oxide layer 56 of approximately 500 to 1000 Angstroms thickness is thermally grown from the exposed silicon surfaces of the wafer. Then, another oxide layer 58 of approximately 2500 Angstroms thickness is deposited on top of oxide layer 56. FIG. 6 shows the base and emitter regions 36 and 50 and oxide layers 56 and 58 in more detail. Oxide layer 56 is thicker at inside corners 57 and 59, and thinner at outside corners 61 and 63, than along the flat surfaces. This occurs because the rate of oxide growth from all silicon surfaces is uniform, causing the oxide to pile up in the inside corners, and spread out from the outside corners.

It has been found to be advantageous to use a composite of two layers of oxide. The oxide layers serve two distinct functions. Firstly, the spacer oxide 60 and 62 (described below) will be formed from the inner oxide layer 56, so insulative integrity is critical. Since oxide layer 56 is thermally grown, it has a high integrity with virtually no pin holes. Secondly, an anisotropic etching process is used to form the spacer oxide, as described below. For the etching step to work properly, a thicker oxide layer than is readily formed thermally is required. Although the inner oxide layer 56 could be grown to the necessary thickness of the combined layers, it is quicker to deposit the outer oxide layer 58 to form the requisite thickness. The lower integrity of deposited oxide layer 58 does not impair the anisotropic etching process or the quality of the spacer oxide. In other embodiments of the process, layer 58 may comprise a refractory insulating material such as silicon nitride.

Figure 7:
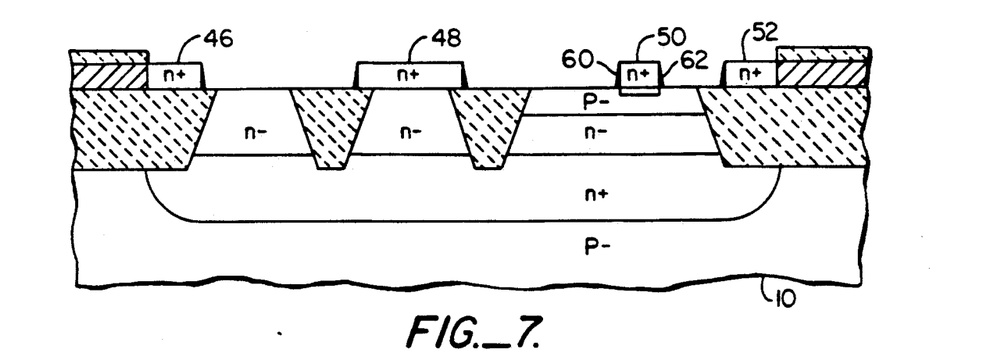
FIG. 7 is a sectional view of the semiconductor substrate after a sixth preliminary step during the fabrication of the self-aligned bipolar transistor.
Figure 8:
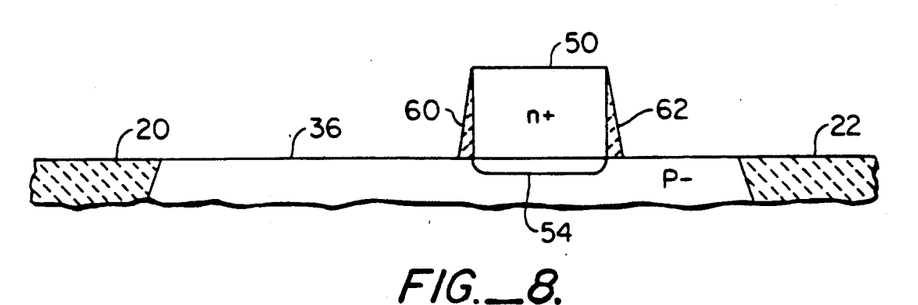
FIG. 8 is an enlarged sectional view of a portion of the semiconductor substrate shown in FIG. 7.

The next step of the process is to form the spacer oxide by anisotropic etching, as illustrated in FIGS. 7 and 8. Anisotropic etching is an etching process that preferentially etches in a vertical direction. In other words, its vertical etching rate is much greater than its horizontal etching rate. In the preferred embodiment of the present invention, anisotropic etching is performed by reactive-ion etching, a commonly used anisotropic etching process. Reactive-ion etching has the added advantage of a high silicon-to-silicon dioxide etch ratio, so that the desired removal of silicon dioxide occurs at a far faster rate than does the undesired removal of silicon. The reactive-ion etching of silicon dioxide over silicon is well known and may be carried out using commercially available equipment.

Anisotropic etching continues until all oxide is removed from the horizontal upper surfaces of the wafer. The etching process exposes the horizontal upper surfaces before it reaches the vertical side walls because the vertical thickness of the oxide is thinner above the horizontal surfaces than above the inside corners, and because the etching action is vertically preferential. When the oxide from oxide layers 56 and 58 has been removed from the horizontal upper surfaces of the wafer, a residual amount of oxide remains on the vertical side walls of n+ regions 46, 48, 50, and 52. The residual oxide on the side walls of the emitter contact region 50 is the spacer oxide 60 and 62 that will insulate between the emitter and the base contact. The spacer oxide is thin near the upper surface of the emitter contact region, and increases in thickness toward the upper surface of the base region.

The thickness of the spacer oxide is controlled by the anisotropic etching process, not photolithographically. Accordingly, the thickness of the spacer oxide is not limited by the alignment precision of photolithography. Three parameters control the thickness of the spacer oxide layer: vertical-to-horizontal etching ratio, duration of the etching process, and thickness of oxide layers 56 and 58. An anisotropic etching process with a lower vertical-to-horizontal etching ratio will form thinner spacer oxide layers than a process with a higher ratio. Also, increasing the duration of the etching process will form thinner spacer oxide layers. It has been found, for example, that a spacer oxide thickness of 2000 to 3500 Angstroms at the upper surface of the base region is readily achieved.

Figure 9:
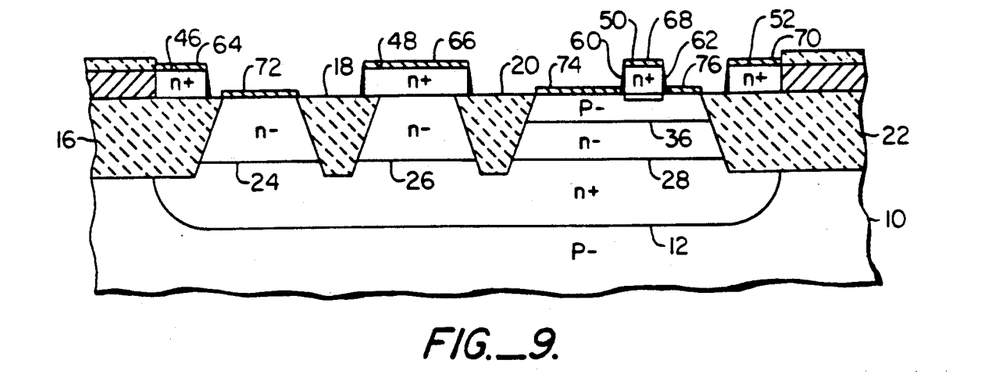
FIG. 9 is a sectional view of the semiconductor substrate after a seventh preliminary step during the fabrication of the self-aligned bipolar transistor.
Figure 10:
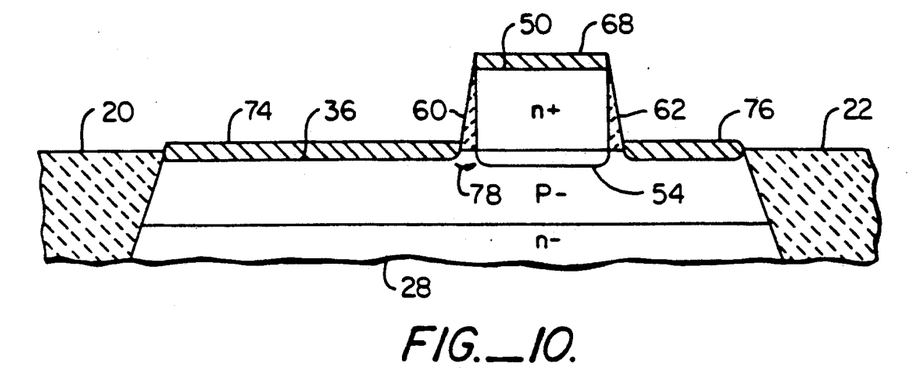
FIG. 10 is an enlarged sectional view of a portion of the semiconductor substrate shown in FIG. 9.

FIGS. 9 and 10 illustrate the next step of forming the silicide base contact. First, a thin layer of a metal, described in more detail below, is deposited on the wafer. The thickness of this metal layer in the preferred embodiment is 500 to 1000 Angstroms. The wafer is then heat treated by heating to an elevated temperature for a time sufficient to form electrically conductive metal silicide. Metal silicide is a binary compound of silicon and a metal, and is formed at the elevated temperature wherever metal atoms are in contact with silicon atoms. Metal silicide does not form where the metal layer contacts the oxide regions. Metal silicide does form on the polycrystalline silicon upper surfaces of n+ regions 46, 48, 50, and 52, on the epitaxial silicon upper surface of n− region 24, and on the silicon upper surface of p− region 36. The silicide thus formed is shown at 64, 66, 68, 70, 72, 74, and 76 in FIG. 9. Silicide does not form on top of the field oxide regions 16, 18, 20, and 22, nor does it form on the spacer oxide 60 and 62. After the silicide has been formed, all metal not reacting to form silicide is removed by chemically selective etching. The reaction temperature of metal-silicon is between 600 and 750 degrees Celsius for 10 minutes. Since the unreacted metal does not chemically bond with the underlying oxide, it is easily removed.

An additional step of ion implantation may be performed before heat treatment to improve the formation of silicide. That is, silicon atoms may be ion implanted into the metal layer utilizing an energy level that embeds the ions generally at the interface between the metal and underlying silicon. Silicide is formed at the interface by the implanted silicon atoms. The implantation allows more uniform silicide formation during subsequent heat treatment steps.

The metal used to form the silicide layers may be chosen from a wide range of candidates. If no subsequent high temperature processing is required, then nickel, palladium, or platinum may be used. If subsequent processing at a high temperature is required, such as is needed to flow a layer of reflow oxide, then a refractory metal such as titanium, vanadium, chromium, zirconium, niobium, molybdenum, hafnium, tantalum, or tungsten is preferred.

As seen best in FIG. 10, silicide layer 74 and 76 covers the upper surface of p− base region 36, except under the emitter contact region 50 and the spacer oxide regions 60 and 62. Self-alignment of the silicide to the spacer oxide is achieved because silicide is formed on all exposed silicon surfaces. Only the thickness of spacer oxide 60 separates silicide layer 74 from emitter contact region 50. Since silicide is an electrically conductive compound, it may be used as a base contact. By using silicide layer 74 as the base contact, the distance between the base contact and the emitter contact region is quite small, and equals the base thickness of spacer oxide 60. Accordingly, the parasitic base resistance of this structure is also quite small because the base current need only travel a very short distance between the base contact and the active area of the transistor. This distance is given by arrow 78 in FIG. 10. Note that photolithography limitations do not constrain this distance because anisotropic etching, not photolithography, defines the thickness of the spacer oxide.

Figure 11:
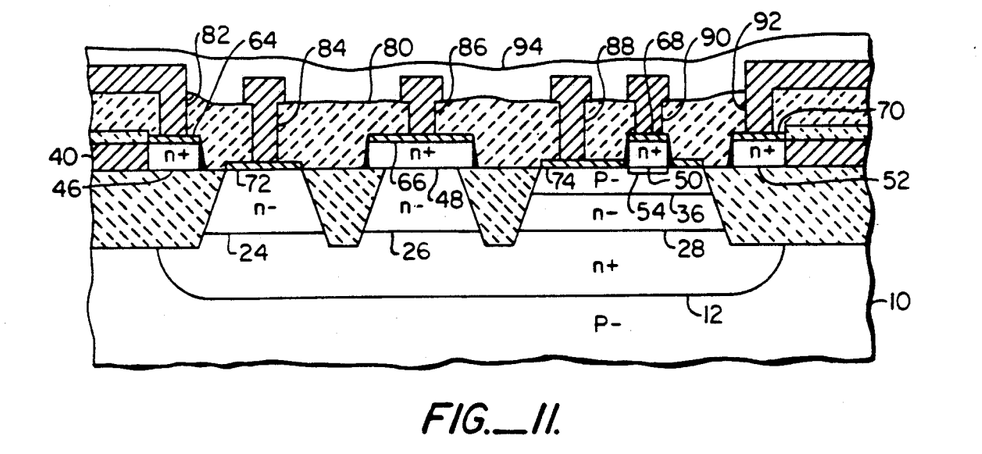
FIG. 11 is a sectional view of the semiconductor substrate after fabrication of the self-aligned bipolar transistor has been completed.

A completed transistor is shown in FIG. 11. Fabrication of the wafer is completed according to standard techniques. After the silicide is formed and all excess metal is removed, an oxide layer 80 is applied to the top of the wafer. If oxide layer 80 is formed by a reflow oxide process, wherein heating to an elevated temperature is utilized to flow the oxide to form a planar upper surface, then the silicide metal must be a refractory metal such as titanium, molybdenum, tungsten, or other refractory metal. After oxide layer 80 is formed, it is photolithographically patterned, and openings to the silicide layers are etched. A metallization layer is deposited, patterned, and etched to form the electrical interconnections of the wafer, including vias 82, 84, 86, 88, 90, and 92. Finally, a passivation layer 94 is deposited on the upper surface of the wafer.

FIG. 11 shows three devices formed by the above described process, an n-p-n transistor, a Schottky diode, and a resistor. The n-p-n transistor includes n+ emitter contact region 50, n+ emitter region 54, silicide layer 68, and via 90 as an emitter, p− base region 36, silicide base contact 74, and via 88 as a base, and n+ regions 12 and 48, n− regions 26 and 28, silicide layer 66, and via 86 as a collector. The self-aligned metal silicide base contact structure of the present invention substantially improves the switching speed of this transistor by reducing its parasitic base resistance.

A Schottky diode is also formed by the above described process. The Schottky diode includes n− region 24, silicide layer 72, and via 84. The diode is formed during the formation of the transistor, and requires no additional processing steps. It can be interconnected as desired using via 84.

Resistors may also be formed by the above described process. FIG. 11 actually shows parts of two resistors, one extending to the left, and the other extending to the right. The resistor on the left includes n− polycrystalline silicon layer 40 as its resistive element, and n+ region 46, silicide layer 64, and via 82 as an electrical connection at one end of the resistor. Layer 40 extends to another connection that looks similar to the one provided by n+ region 52, silicide layer 70, and via 92. The length and resistivity of layer 40 determines the value of the resistor. By permitting resistors and diodes to be constructed on the same wafer as fast bipolar transistors, the present invention provides a broad degree of design freedom to circuit designers.

Figure 12:
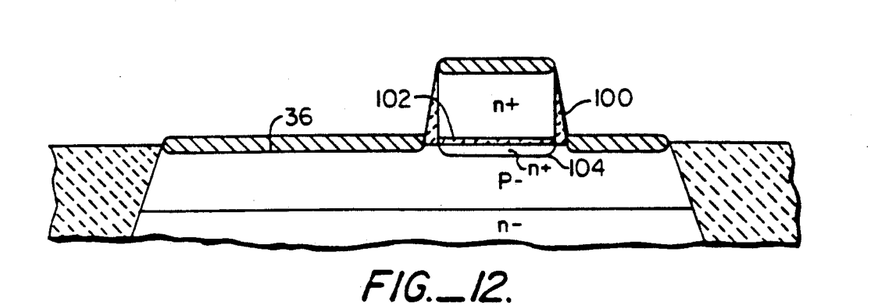
FIG. 12 is an enlarged sectional view of a portion of a semiconductor substrate and illustrates an alternative embodiment of the present invention.

FIG. 12 illustrates an alternative embodiment of a self-aligned silicide base contact structure for a tunnel emitter transistor. An n+ emitter contact region 100 is provided with an additional thin oxide layer 102. Oxide layer 102 is formed after thermal oxide layer 32 (see FIG. 2) is removed and before polycrystalline silicon layer 40 (see FIG. 3) is applied. To form oxide layer 102, a thin oxide layer is first grown upon the upper surface of p— base region 36 to a thickness of approximately twenty Angstroms. The thin oxide layer is then patterned and etched to leave only layer 102, above which emitter contact region 100 will later be formed. After the polycrystalline emitter is formed, the wafer is heated to an elevated temperature to permit the n+ impurity atoms of the emitter to diffuse across oxide layer 102 and into the p— base region to form n+ emitter region 104. Subsequent processing is performed according to the process described above. Tunnel emitter transistors are known to provide high current gain devices.

From the above description, it will be apparent that the invention disclosed herein provides a novel and advantageous structure forming, and a process for fabrication, a self-aligned silicide base contact for a bipolar transistor. As will be understood by those familiar with the art, the invention may be embodied in other specific forms without departing from the spirit or essential characteristics thereof. For example, p-n-p transistors could be constructed by using the present invention. Or other semiconductor materials could be substituted for silicon. Accordingly, the disclosure of the present invention is intended to be illustrative, but not limiting, of the scope of the invention, which is set forth in the following claims.

What is claimed is:

1. A process for forming a bipolar transistor comprising the steps of:
    providing a lightly doped silicon substrate of a first conductivity type;
    forming a heavily doped buried layer of a second conductivity type on a portion of said substrate;
    growing a lightly doped epitaxial layer of said second conductivity type on top of said buried layer;
    forming a field oxide layer extending into said epitaxial layer to divide said epitaxial layer into first and second regions;
    doping said first region with impurities of a first type to form a lightly doped base region of said first conductivity type;
    depositing a layer of polycrystalline silicon upon the upper surface of said substrate;
    doping said polycrystalline silicon with impurities of a second type to form a heavily doped layer of said second conductivity type;
    selectively removing portions of said polycrystalline silicon leaving an emitter contact region positioned above and contacting said base region, and leaving a collector tap region above and contacting said second region, said emitter and collector tap regions having side walls extending upward from said base and second regions, respectively;
    growing an oxide compound on top of said substrate;
    depositing additional oxide material on top of said oxide compound, the oxide compound and oxide material together forming a first oxide layer;
    removing most of said first oxide layer by anisotropically etching said first oxide layer until the upper surfaces of said collector tap, base, and emitter regions are free of oxide, leaving a residual amount of oxide on said side walls;
    depositing a layer of a first metal upon the upper surface of said base region and said emitter region;
    heating said layer of a first metal to an elevated temperature for a period of time sufficient for a silicide to form between said first metal and the silicon exposed on the upper surface of said base region and said emitter region, wherein said silicide forms a base contact and an emitter contact that are separated from each other by said residual amount of oxide; and
    removing excess first metal not forming said silicide.

2. A process for forming a bipolar transistor and a resistor comprising the steps of:
    providing a lightly doped silicon substrate of a first conductivity type;
    forming a heavily doped buried layer of a second conductivity type on a portion of said substrate;
    growing a lightly doped epitaxial layer of said second conductivity type on top of said buried layer;
    forming a field oxide layer extending into said epitaxial layer to divide said epitaxial layer into first and second regions;
    doping said first region with impurities of a first type to form a lightly doped base region of said first conductivity type;
    depositing a layer of polycrystalline silicon upon the upper surface of said substrate;
    forming a resistor oxide layer on top of said layer of polycrystalline silicon;
    removing portions of said resistor oxide layer to expose regions wherein doping is desired, and leaving said resistor oxide layer over a resistive element region of said polycrystalline silicon;
    doping said exposed regions of said polycrystalline silicon with impurities of a second type to form a heavily doped layer of said second conductivity type;
    selectively removing portions of said polycrystalline silicon leaving an emitter contact region positioned above and contacting said base region, and leaving a collector tap region above and contacting said second region, said emitter contact and collector tap regions having side walls extending upward from said base and second regions, and leaving first and second resistor contacts each coupled to an end of said resistive element region, respectively;
    growing an oxide compound on top of said substrate;
    depositing additional oxide material on top of said oxide compound, the oxide compound and oxide material together forming a first oxide layer;
    removing most of said first oxide layer by anisotropically etching said first oxide layer until the upper surfaces of said collector tap, base, and emitter regions are free of oxide, leaving a residual amount of oxide on said side walls;
    depositing a layer of a first metal upon the upper surface of said base region;
    heating said layer of a first metal to an elevated temperature for a period of time sufficient for a silicide to form between said first metal and the silicon exposed on the upper surface of said base region, wherein said silicide forms a base contact that is separated from said emitter region by said residual amount of oxide; and
    removing excess first metal not forming said silicide.

3. A process as recited in claim 2 further comprising the steps of:
    depositing a second oxide layer over the upper surface of said substrate after said step of removing excess first metal;

selectively removing portions of said second oxide layer to open contact holes to said tap region, said base contact, and said emitter region;

depositing a layer of a second metal on top of said substrate; and selectively removing portions of said second metal to form separate electrical connections with said collector tap region, said base contact, and said emitter region.

4. A process as recited in claim 2 wherein said first metal is selected from a group consisting of: titanium, vanadium, chromium, zirconium, niobium, molybdenum, hafnium, tantalum, and tungsten.

5. A process as recited in claim 2 wherein said second oxide layer is a reflow oxide material, and wherein said step of depositing a second oxide layer is followed by an additional step of heating the substrate to an elevated temperature to permit said reflow oxide material to flow.

6. A process as recited in claim 2 wherein said first metal is selected from a group consisting of: nickel, palladium, and platinum.

7. A process as recited in claim 2 wherein said step of depositing a layer of a first metal is followed by an additional step of implanting silicon into said layer.

8. A process as recited in claim 2 wherein said step of depositing a layer of a first metal is additionally operable for depositing said first metal on the upper surfaces of said collector tap and emitter regions, and wherein said silicide also forms upon the upper surfaces of said collector tap and emitter regions.

9. A process as recited in claim 2 wherein said transistor is an n-p-n type transistor, wherein said first conductivity type regions are p-type regions having acceptor impurities, and wherein said second conductivity type regions are n-type regions having donor impurities.

10. A process as recited in claim 2 further comprising a process for forming a Schottky diode, wherein said step of forming a field oxide layer to divide said epitaxial layer into first and second regions is additionally operable for dividing said epitaxial layer into a third region, wherein said process includes a step of forming an electrical contact on the upper surface of said third region, and wherein said third region and said electrical contact form said Schottky diode.

11. A process as recited in claim 2 further comprising the step of:

forming a thin insulative layer on top of said base region prior to said step of growing a layer of polycrystalline silicon; and heating said substrate to an elevated temperature after said step of implanting said polycrystalline silicon to diffuse a portion of said impurities of said second type across said thin insulative layer, wherein said emitter region forms a tunnel emitter of said bipolar transistor.

* * * * *